(12) United States Patent
Hu et al.

(10) Patent No.: US 9,688,892 B2
(45) Date of Patent: Jun. 27, 2017

(54) UNDERFILL COMPOSITION AND PACKAGING PROCESS USING THE SAME

(71) Applicants: Henkel IP & Holding GmbH, Duesseldorf (DE); Ablestik (Shanghai) Ltd., Shanghai (CN)

(72) Inventors: Xiaolong Hu, Shanghai (CN); Derek Wyatt, Mission Viejo, CA (US); Jiong England, Orange, CA (US); Paul J. Gleeson, Torrance, CA (US); Renfel He, Shanghai (CN)

(73) Assignees: Henkel AG & Co. KGaA, Duesseldorf (DE); Henkel IP & Holding GmbH, Duesseldorf (DE)

(*) Notice: Subject to any disclaimer, the term of this patent is extended or adjusted under 35 U.S.C. 154(b) by 0 days.

(21) Appl. No.: 14/804,418

(22) Filed: Jul. 21, 2015

(65) Prior Publication Data
US 2015/0322309 A1 Nov. 12, 2015

Related U.S. Application Data

(63) Continuation of application No. PCT/CN2013/007087, filed on Jan. 23, 2013.

(51) Int. Cl.
| C09J 163/10 | (2006.01) |
| H01L 23/29 | (2006.01) |
| C08K 3/04 | (2006.01) |
| C08G 59/40 | (2006.01) |
| H01L 21/56 | (2006.01) |

(52) U.S. Cl.
CPC .......... *C09J 163/10* (2013.01); *C08G 59/40* (2013.01); *C08K 3/04* (2013.01); *H01L 23/293* (2013.01);
(Continued)

(58) Field of Classification Search
CPC ..... C09J 163/00; C09J 163/10; H01L 23/293; H01L 2224/92125; H01L 2224/73204;
(Continued)

(56) References Cited

U.S. PATENT DOCUMENTS 6,833,629 B2   12/2004   Ma et al.
8,017,444 B2 *  9/2011   Inada ............... H01L 24/83
                                            257/686

(Continued)

FOREIGN PATENT DOCUMENTS

CN   102010686    4/2011
JP   2005-513779  5/2005
(Continued)

OTHER PUBLICATIONS

Photoinitiators for UV curing: Key Product Guide 2003 for Ciba. [online]. retrieved online on [Aug. 8, 2016]. Retrieved from Internet<https://people.rit.edu/deeemc/reference_13/Imprint/Photoinitiators%20for%20UV%20curing.pdf>.*
(Continued)

*Primary Examiner* — Sanza McClendon
(74) *Attorney, Agent, or Firm* — Steven C. Bauman (57) ABSTRACT

The present invention provides a one part liquid underfill composition comprising an epoxy resin, a latent epoxy curing agent, a photocurable resin or monomer, a photoinitiator, an optional filler, and an optional thermal initiator. Also provided is a packaging process using the underfill composition.

22 Claims, 3 Drawing Sheets

(52) U.S. Cl.
CPC ...... *C08K 2003/045* (2013.01); *H01L 21/563* (2013.01); *H01L 2224/16225* (2013.01); *H01L 2224/32225* (2013.01); *H01L 2224/73204* (2013.01); *H01L 2224/92125* (2013.01); *H01L 2924/19105* (2013.01)

(58) Field of Classification Search
CPC . H01L 2224/32225; H01L 2224/16225; H01L 2224/19105; H01L 2924/19105; H01L 21/563; C08G 59/40
USPC .................................................. 522/100, 170
See application file for complete search history.

(56) References Cited

U.S. PATENT DOCUMENTS

2003/0131937 A1* 7/2003 Konarski ............... C08G 59/18
156/330
2007/0082203 A1* 4/2007 Canelas ................ C08F 210/06
428/413
2007/0241434 A1* 10/2007 Inada ...................... H01L 24/83
257/678
2009/0075429 A1* 3/2009 Sato ...................... H01L 23/293
438/118

FOREIGN PATENT DOCUMENTS

WO      2005056675      6/2005
WO      2007050611      5/2007

OTHER PUBLICATIONS

International Search Report issued in connection with International Patent Application No. PCT/CN2013/070873 mailed on Oct. 31, 2013.

* cited by examiner

UNDERFILL COMPOSITION AND PACKAGING PROCESS USING THE SAME

The present invention relates to an underfill composition, especially, a one part liquid underfill composition, and to a packaging process using the underfill composition.

BACKGROUND

With the development of hand-held electronic devices like smart phone and tablet, such devices become increasingly thinner but with more and more functions, which makes Printed Circuit Board (PCB) design more and more complicated. Thousands of components including packages like CSPs (chip size or chip scale packages), BGAs (ball grid arrays), LGAs (land grid arrays) and POPs (package on packages), and elements like resistors, capacitors and so on are integrated on a small PCB. Generally, CSP/BGA packages are surrounded by lots of elements. Some of such elements are very sensitive, and contamination by underfill adhesives may cause quality issues.

Underfill compositions (also referred as underfill adhesives) are widely used on integrated circuit boards of handheld electronic devices to improve so called "drop-test" performance and to absorb some of the stress of thermal cycling. Underfill adhesives can flow under CSP/BGA packages with or without board preheating to fill the gap between the package and the PCB by capillary action and form fillet around the package. Then the liquid underfill adhesives become crosslinked solids via heat cure; accordingly provide protection to solder joints.

Figure 1:
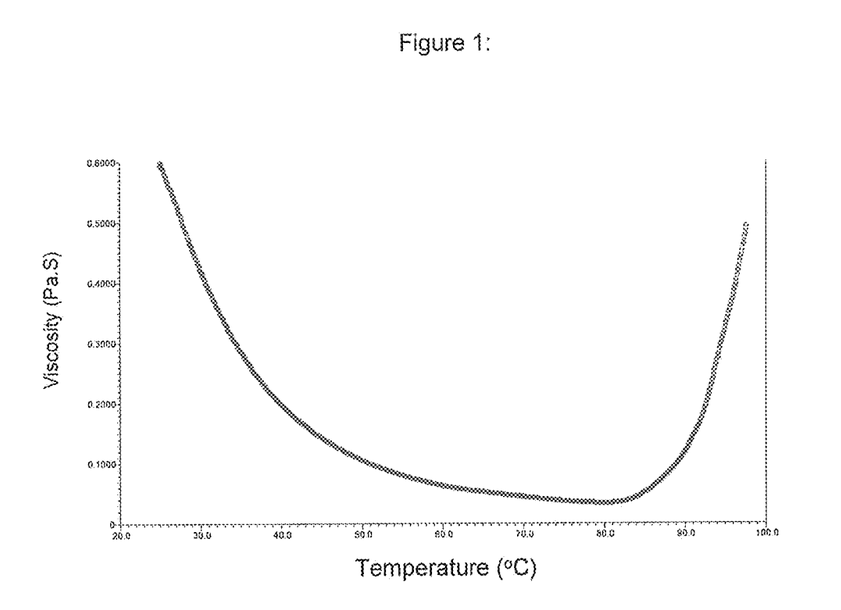
FIG. 1 shows a typical viscosity—temperature profile of a one part heat curable epoxy adhesive of the prior art.

Generally, underfill adhesives are based on epoxy resins, and additionally contain a latent epoxy curing agent (such as anhydrides, amines, imidazoles, thiols and the like), an accelerator, an active diluent, and other additives (such as wetting agents, adhesion promoters, defoamers and the like). FIG. 1 shows a typical viscosity—temperature profile of a traditional heat curable underfill adhesive. With temperature rising, the viscosity of the underfill adhesive initially reduces and then increases dramatically after the occurrence of curing reaction. Based on this property, a preheating step can be employed to quicken the flow speed of underfill adhesives when their viscosities are too high. However, this property also causes difficulty in controlling the accuracy of the underfill flow during the heat cure. Underfill adhesives may flow out at an elevated temperature and contaminate some resistors and capacitors around the packages, accordingly lead to quality issues.

In order to increase manufacturing throughput and reduce cost, low viscosity underfill adhesives are used widely in the industry. Such low viscosity underfill adhesives flow fast at room temperature, and thus greatly reduce flow time and dispense with the board preheating step, accordingly increase throughput and reduce the process cost. However, the use of such low viscosity underfill adhesives causes a big challenge to accurately control underfill flow. Contamination issue cannot be avoided even with a very accurate control of adhesive volume.

Higher viscosity underfill adhesives have a lower flow speed and can be used to avoid such overflow problems in some degree. However, the manufacturing throughput is reduced therewith.

US2002/128353 and US2004/087681 describe a fluxing no-flow underfill adhesive respectively. Such no-flow underfill adhesive contains an epoxy resin, a hardener and a fluxing agent (an organic acid), and can be cured with a reflow soldering process with or without a post cure. The no-flow property can help to effectively control the flow speed of underfill adhesives. However such no-flow underfill technology has a very narrow reflow operation window to balance soldering and the underfill cure process. It's very difficult to use such no-flow materials in the complicated surface mounting process.

Therefore, there is still a need for underfill compositions which have a low viscosity ensuring a high manufacturing throughput and the flow of which under the packages can be accurately controlled so as not to over flow and not to contaminate the elements surrounding the packages.

SUMMARY OF THE INVENTION

To solve the problems mentioned above, it is one object of the present invention to provide a one part liquid underfill composition comprising:
  an epoxy resin,
  a latent epoxy curing agent,
  a photocurable resin or monomer,
  a photoinitiator,
  optionally, a filler, and
  optionally, a thermal initiator.

In an embodiment of the present invention, the underfill composition comprises about 10 wt % to about 90 wt %, preferably about 30 wt % to about 80 wt %, more preferably about 45 wt % to about 65 wt % of the epoxy resin based on the total composition.

In an embodiment of the present invention, the epoxy resin comprises at least one multifunctional epoxy resin, optionally together with one or more monofunctional epoxy resins.

In an embodiment of the present invention, the multifunctional epoxy resin is included in an amount within the range of about 20 wt % to 100 wt %, preferably about 40 wt % to about 95 wt %, more preferably about 60 wt % to about 95 wt %, of the total epoxy resin.

In an embodiment of the present invention, the multifunctional epoxy resin is selected from the group consisting of bisphenol-A epoxy resins, bisphenol-F epoxy resins, novolac epoxy resins, 2,6-diglycidyiphenyl glycidyl ether, naphthalene epoxy resins, cycloaliphatic epoxy resins, polyepoxy compounds based on aromatic amines and epichlorohydrin, polyglycidyl derivatives of phenolic compounds, polyepoxides prepared from polyols, polybutadiene and the like, polyglycidyl derivatives of phenol-formaldehyde novolacs, and polyglycidyl adducts of amines, aminoalcohols and polycarboxylic acids.

In an embodiment of the present invention, the monofunctional epoxy resin has a viscosity of less than about 300 at 25° C.

In an embodiment of the present invention, the monofunctional epoxy resin is selected from the group consisting of p-tert-butyl phenyl glycidyl ether, cresyl glycidyl ether, neodecanoic acid glycidyl ether, alkyl C12-C14 glycidyl ether, butyl glycidyl ether, 2-ethylhexyl glycidyl ether, and nonylphenyl glycidyl ether.

In an embodiment of the present invention, the underfill composition comprises about 0.5 wt % to about 50 wt %, preferably about 10 wt % to about 40 wt % of the latent epoxy curing agent based on the total composition.

In an embodiment of the present invention, the latent epoxy curing agent may be present in an amount of from about 0.1 to about 50 parts by weight, preferably from 0.5 to 30 parts by weight, preferably from 0.5 to 20 parts by weight per 100 parts by weight of the epoxy resin.

In an embodiment of the present invention, the underfill composition comprises about 0.1 wt % to about 50 wt %, preferably 10 wt % to about 30 wt % of the photocurable resin or monomer based on the total composition.

In an embodiment of the present invention, the photocurable resin or monomer is selected from the group consisting of (methyl)acrylate monomers or oligomers, vinyl ethers, and photocurable epoxy resins.

In an embodiment of the present invention, the underfill composition comprises about 0.2 wt % to about 10 wt %, preferably about 1 wt % to about 6 wt %, more preferably about 3 wt % to about 5 wt %, of the photoinitiator based on the total composition.

In an embodiment of the present invention, the photoinitiator may be present in an amount of from about 0.1 to about 5 parts by weight, preferably from about 0.2 to about 4 parts by weight per 100 parts by weight of the photocurable resin or monomer.

In an embodiment of the present invention, the photoinitiator can be activated in a wavelength range of from about 250 nm to 850 nm, preferably from about 300 nm to 450 nm, more preferably from about 300 nm to 400 nm.

In an embodiment of the present invention, the photoinitiator can be cationic-type photoinitiators and free-radical-type photoinitiators, especially, selected from the group consisting of benzophenone, acetophenone, chlorinated acetophenone, dialkoxyacetophenones, dialkylhydroxyacetophenones, dialkylhydroxyacetophenone esters, benzoin, benzoin acetate, benzoin alkyl ethers, dimethoxybenzoin, dibenzylketone, benzoylcyclohexanol and other aromatic ketones, acyloxime esters, acylphosphine oxides, acylphosphonates, ketosulfides, dibenzoyldisulphides, diphenyldithiocarbonate, diphenyl(2,4,6-trimethylbenzoyl) phosphine oxide, phosphonium salts, sulfonium salts, and iodonium salts.

In an embodiment of the present invention, the underfill composition comprises 0 wt. % to about 5 wt. % of the thermal initiator based on the total composition.

In an embodiment of the present invention, the thermal initiator may be present in an amount of from about 0.1 to about 5 parts by weight, preferably from about 0.2 to about 4 parts by weight per 100 parts by weight of the photocurable resin or monomer.

In an embodiment of the present invention, the thermal initiator is selected from peroxides and azo-compounds, especially, from the group consisting of di(4-tert-butylcyclohexyl) peroxydicarbonate, tert-butyl peroxyneodecanoate, tert-butyl peroxypivalate, dilauroyl peroxide, 2,2'-azodi(isobutyronitrile), 2,5-dimethyl-2,5-di(2-ethylhexanoylperoxy)-hexane, and tert-butyl peroxy-2-ethylhexanoate, tert-butyl peroxybenzoate.

In an embodiment of the present invention, the underfill composition comprises 0 wt % to about 60 wt % of the filler based on the total composition.

In an embodiment of the present invention, the filler is selected from the group consisting of alumina, silica and magnesia, especially, with a spherical shape, particularly, having an average particle size of from 1 nm to 20 μm, preferably from 5 nm to 10 μm.

In an embodiment of the present invention, the underfill composition has a viscosity ranging from 50 mPa·s to 10000 mPa·s, preferably 100~5000 mPa·s, more preferably 150~1500 mPa·s.

It is another object of the present invention to provide a packaging process using the underfill composition of the present invention. The packaging process of the present invention can accurately control the underfill flow without sacrifice of throughput. The packaging process of the present invention comprises the steps of:

a) providing an assembly of a package and a circuit board;

b) dispensing the underfill composition;

c) the underfill composition flowing by capillary action to fill the gap between the package and the circuit board with or without board preheating, and forming fillet;

d) partially or fully curing the fillet by exposure to a UV light and/or a visible light; and e) completely curing the uncured underfill composition by heat.

In the present invention, the package comprises CSP, BGA, LGA, and POP.

In an embodiment of the present invention, the intensity of the light in step d) is from 30 mJ/cm$^2$ to 4000 mJ/cm$^2$, preferably from 100 mJ/cm$^2$ to 3000 mJ/cm$^2$.

In an embodiment of the present invention, the light has a wavelength within the range of 250 nm to 850 nm, preferably of 300 nm to 450 nm, more preferably of 300 nm to 400 nm.

In an embodiment of the present invention, the heat cure step e) can be conducted at a temperature in the range of 60° C. to 250° C., preferably of 70° C. to 200° C., more preferably of 80° C. to 160° C.

In an embodiment of the present invention, the circuit board is not preheated.

The underfill composition of the present invention has the following advantages: 1) it shows a good flow performance with or without board preheating and can fill the gap between a package and a circuit board quickly and form fillet; 2) the fillet can be partially or fully cured under exposure to a UV or visible light so as to prevent the underfill from flowing out during the subsequent heat cure; and 3) After photocure, the uncured underfill composition can be fully cured by heat so as to provide support on solder joints.

The packaging process using the underfill composition of the present invention can provide accurate control on the underfill flow and hence no adhesive contamination on the elements surrounding the package while ensuring the throughput.

DETAILED DESCRIPTION OF THE INVENTION

The present invention will be described in details as followings. The materials, methods, and examples herein are illustrative only and, except as specifically stated, are not intended to be limiting. Although methods and materials similar or equivalent to those described herein can be used in the practice or testing of the present invention, suitable methods and materials are described herein.

All publications and other references mentioned herein are explicitly incorporated by reference therein in their entirety.

Unless otherwise defined, all technical and scientific terms used herein have the same meanings as commonly understood by those skilled in the art. In case of conflict, the present specification, including definitions, will control.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions with range. It is not intended that the scope of the present invention be limited to the specific values recited when defining a range.

Use of "a" or "an" is employed to describe elements and components of the present invention. This is done merely for convenience and to give a general sense of the invention. This description should be read to include one or at least one and the singular also includes the plural unless it is obvious that it is meant otherwise.

Underfill Composition

In one aspect of the present invention, provided is a one part liquid underfill composition, which comprises: an epoxy resin, a latent epoxy curing agent, a photocurable resin or monomer, a photoinitiator, an optional filler, and an optional thermal initiator. Each of these components will be described in detail as followings.

Epoxy Resin

Epoxy resins that can be used in the underfill composition of the present invention are curable compounds and capable of polymerization. As used herein, to cure means to polymerize, with cross-linking. Cross-linking, as understood in the art, is the attachment of two-polymer chains by bridges of an element, a molecular group, or a compound, and in general takes place upon heating.

The term "epoxy resin" used herein comprises monofunctional epoxy resin and multifunctional epoxy resin. The term "multifunctional epoxy resin" intends to include those epoxy resins comprising more than one epoxy groups in the molecular chain. The term "monofunctional epoxy resin" intends to include those epoxy resins comprising one epoxy group in the molecular chain.

In the present invention, the underfill composition may comprise about 10 wt. % to about 90 wt. %, preferably about 30 wt. % to about 80 wt. %, more preferably about 45 wt. % to about 65 wt. % of the epoxy resin based on the total composition.

Any common epoxy resins can be used in the underfill composition of the present invention either alone or in combination.

In one embodiment of the present invention, the epoxy resin comprises at least one multifunctional epoxy resin, optionally together with one or more monofunctional epoxy resins. Ordinarily, the multifunctional epoxy resin is included in an amount within the range of about 20 wt. % to 100 wt. %, preferably 40 wt. % to 95 wt. % of the total epoxy resin.

The multifunctional epoxy resins can be used in the present invention include generally, but not limited to, bisphenol-A epoxy resins (such as Epiclon 850s and Epiclon 850CRP from DIC, Japan; DER332 from Dow Chemical, U.S.; RE-310S from Nippon Kayaku, Japan), bisphenol-F epoxy resins (such as Epiclon 830CRP from DIC; RE-404S from Nippon Kayaku), novolac epoxy resins (such as Epikote 152 from Dow Chemical Co., U.S.), 2,6-diglycidyl-phenyl glycidyl ether, naphthalene epoxy resins and cycloaliphatic epoxy resins (such as Celloxide 2021P and Celloxide 2081 from Daicel, Japan).

Other suitable multifunctional epoxy resins include polyepoxy compounds based on aromatic amines and epichlorohydrin, such as N,N,N',N'-tetraglycidyl-4,4'-diaminodiphenyl methane; N-diglycidyl-4-aminophenyl glycidyl ether; and N,N,N',N'-tetraglycidyl-1,3-propylene bis-4-aminobenzoate.

The multifunctional epoxy resins suitable for use herein also include polyglycidyl derivatives of phenolic compounds, such as those available commercially under the tradename EPON, such as EPON 828, EPON 1001, EPON 1009, and EPON 1031 from Momentive, U.S.; DER 331, DER 332, DER 334, and DER 542 from Dow Chemical; and BREN-S from Nippon Kayaku.

Other multifunctional suitable epoxy resins include polyepoxides prepared from polyols, polybutadiene and the like and polyglycidyl derivatives of phenol-formaldehyde novolacs. Commercialized polyepoxides prepared from polyols include DER732, DER736 from Dow chemical. Commercialized ploybutadiene epoxy resins include Epolead PB3600 and PB4700 from Daicel. Examples of commercialized novolac epoxy resins include DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Huntsman, U.S. SU-8 is a bisphenol-A-type epoxy novolac available from Momentive. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Huntsman.

The monofunctional epoxy resin may be used herein as a reactive diluent to adjust the viscosity of the epoxy resin. Appropriate monofunctional epoxy diluents for use herein include those having a viscosity lower than that of the above-mentioned multifunctional epoxy resins, ordinarily, less than about 300 cps at 25° C. Examples of such monofunctional epoxy resin are p-tert-butyl phenyl glycidyl ether (such as Heloxy Modifier 65 from Momentive, GE-11 from CVC), cresyl glycidyl ether (such as Heloxy Modifier 62 from Momentive), neodecanoic acid glycidyl ether (such as Cardura N10 from Momentive), alkyl C12-C14 glycidyl ether, butyl glycidyl ether, 2-ethylhexyl glycidyl ether, nonylphenyl glycidyl ether.

Latent Epoxy Curing Agent

The underfill composition of the present invention includes at least one latent epoxy curing agent capable of catalyzing the polymerization of the epoxy resin once a triggering event occurs, such as a certain temperature is reached. The Latent epoxy curing agent used herein is stable at a lower temperature such as room temperature and can be activated at a high temperature, typically at a temperature above 50° C.

Any common latent epoxy curing agents used in the art can be used in the present invention without special limitations. For example, suitable latent epoxy curing agents used herein are described in U.S. Pat. No. 4,546,155, U.S. Pat. No. 7,226,976, U.S. Pat. No. 4,833,226, JP2008214567, GB1,121,196, and U.S. Pat. No. 5,077,376, the disclosures of which are hereby expressly incorporated herein in their entireties by reference.

Examples of commercially available latent epoxy curing agents include Amicure PN-23, PN-40, PN-H, MY-24, PN-50 (commercially available from Ajinomoto Co., Inc., Japan); EH-4337S, EH-3293S, EH-4357S (commercially available from Asahi Denka Co. Ltd., Japan); Novacure HX-3722, HXA-3921 HP (commercially available from Asahi Kasei Kogyo. K.K., Japan). Sunmide LH-210, Ancamin 2014AS/FG, Ancamin 2337S (commercially available from Air Products and Chemicals, Inc., U.S.).

Other suitable latent epoxy curing agents include dicyandiamide and its' derivates, imidazoles such as 2-heptadeoylimidazole, 2-phenyl-4,5-dihydroxymethylimidazole, 2-phenyl-4-methyl-5-hydroxymethylimidazole, 2-phenyl-4-benzyl-5-hydroxymethyl-imidazole, 2,4-diamino-8-2-methylimidazolyl-(1)-ethyl-5-triazine, additional products of triazine with isocyanuric acid, succinohydrazide, adipohydrazide, isophtholohydrazide, o-oxybenzohydrazide and salicylohydrazide.

Other suitable latent curing agents can be cationic type latent epoxy curing agents, such as bronsted acid like trifluoromethane sulfonic acid, p-toluene sulfonic acid, camphor sulfonic acid; Alkyl or silyl esters of the such bronsted acid, like trifluoromethane sulfonic acid trimethylsilyl ester; Lawis acid such as metal halide like $BX_3$, $AlX_3$, $PX_5$, $TiX_4$, $FeX_3$, $ZnX_2$, $SnX_4$, where X is selected from F, Cl, Br and I; onium salts, preferably those selected from the groups of phosphonium salts $R_4P^+Y^-$, sulfonium salts $R_3S^+Y^-$, and iodonium salts $R_2I^+Y^-$, where R is preferably selected from any alkyl groups aryl groups, and $Y^-$ is preferably selected from $BF_4^-$, $PF_6^-$, and $SbF_6^-$.

And of course, combination of different latent curing agents is also desirable for use herein.

In the present invention, the underfill composition comprises about 0.5 wt % to about 40 wt %, preferably about 1 wt % to about 30 wt % of the latent epoxy curing agent based on the total composition.

In addition, the latent curing agent may suitably be present in amounts of from about 0.1 to about 50 parts by weight, desirably from about 0.5 to about 30 parts by weight, more desirably from about 0.5 to about 20 parts by weight per 100 parts by weight of the epoxy resin.

The latent curing agent may be prepared by any industrially recognized methods, or may be obtained commercially where available.

Photocurable Resin or Monomer

The photocurable resin or monomer of the present invention refers to those materials curable either by a UV light or a visible light. Those commonly used in the art may be used herein, and examples of which include any common monofunctional or multifunctional (meth)acrylate monomers or oligomers, for example, isobornyl (meth)acrylate, lauryl (meth)acrylate, tridecyl (meth)acrylate, glycidyl methacrylate, allyl meth(acrylate), cyclohexane dimethanol di(meth)acrylate, 1,4-butanediol di(meth)acrylate, ethoxylatedn bisphenol-A di(meth)acrylate (n=1~10), trycyclodecane dimethanol diacrylate, trimethylolpropane trimethacrylate, and pentaerythritol tetraacrylate.

Other suitable acrylates also can be any common acrylate oligomers like epoxy acrylate oligomers, urethane acrylate oligomers, polyester acrylate oligomers, polybutadiene acrylate oligomers; and examples of which are CN965, CN996, CN816, CN301, CN293, CN2204, CN104 (commercially available from Sartomer Co. Inc., U.S.).

Other suitable photocurable resins or monomers may include vinyl ether materials, such as vinylcyclohexene oxide, vinylcyclohexene dioxide.

Optionally, the photocurable resin or monomer also includes epoxy resins or monomers, which are described in "Ring-Opening Polymerizations", Vol. 2, by Frisch and Reegan, Marcel Dekker, Inc. (1969). Suitable epoxies are aliphatic, cycloaliphatic, aromatic or heterocyclic and will typically have an epoxy equivalency of from 1 to 6, preferably 1 to 3. Example of such epoxy resins or monomers include 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, bis(3,4-epoxy-6-methylcyclohexylmethyl)adipate, dicyclopentadiene dioxide, epoxidized polybutadiene, 1,4-butanediol diglycidyl ether, polyglycidyl ether of phenolformaldehyde resole or novolak resin, resorcinol diglycidyl ether, epoxy silicones, e.g., dimethylsiloxanes having cycloaliphatic epoxide or glycidyl ether groups, aliphatic epoxy modified with propylene glycol and dipentene dioxide.

The photocurable resin or monomer can be used in the underfill composition of the present invention either alone or in combination.

In the present invention, the underfill composition comprises about 0.1 wt % to about 50 wt %, preferably 10 wt % to about 30 wt % of the photocurable resin or monomer based on the total composition.

Photoinitiator

The photoinitiator in the underfill composition according to the present invention can be based on a free radical initiating mechanism or a cationic initiating mechanism. These photoinitiators are active in the UV or visible range, of approximately 250-850 nm, preferably in the range of 300 to 450 nm and more preferably of 300 nm to 400 nm so that the compositions can be cured by exposure to a low intensity UV or visible light.

Examples of photoinitiators based on free radical mechanism include benzophenone, acetophenone, chlorinated acetophenone, dialkoxyacetophenones, dialkylhydroxyacetophenones, dialkylhydroxyacetophenone esters, benzoin, benzoin acetate, benzoin alkyl ethers, dimethoxybenzoin, dibenzylketone, benzoylcyclohexanol and other aromatic ketones, acyloxime esters, acylphosphine oxides, acyiphosphonates, ketosulfides, dibenzoyldisulphides, diphenyldithiocarbonate and diphenyl(2,4,6-trimethylbenzoyl) phosphine oxide. Particularly suitable photoinitiators include IRGACURE® 184, hydroxycyclohexyl phenyl ketone, available from Ciba Specialty Chemicals in Tarrytown, N.Y. and LUCIRIN® TPO, diphenyl-2,4,6-triphenylbenzoyl phosphine oxide available from BASF Corporation in Mount Olive, N.J., U.S.

Examples of photoinitiators based on cationic initiating mechanism include onium salts, preferably those selected from the groups of phosphonium salts $R_4P^+Y^-$, sulfonium salts $R_3S^+Y^-$, and iodonium salts $R_2I^+Y^-$, where R is preferably selected from any alkyl groups and aryl groups, and $Y^-$ is preferably selected from $BF_4$—, $PF_6$—, and $SbF_6$—.

Particularly suitable photoinitiators include UVI 6976 (available from Dow Chemicals).

Typically, the photoinitiators will be employed in an amount of 0.2 wt. % to 10 wt. %, such as 1 wt. % to 6 wt. % and desirably 3 wt. % to 5 wt. % of the underfill composition.

In an embodiment of the present invention, the photoinitiators may suitably be present in an amount of from about 0.1 to about 5 parts by weight, desirably from about 0.2 to about 4 parts by weight per 100 parts by weight of the photocurable resin and monomer.

Thermal Initiator

When (methyl)acrylates are used as the photocurable resin or monomer in the underfill composition according to the present invention, a thermal initiator is optionally included to cure the (methyl)acrylates part in shadow areas by heat. The thermal initiator can be peroxide- or azo type free radical initiators. The free radical initiators can initiate the cure of (methyl)acrylates rapidly at a temperature from 60° C. to 200° C., desirably from 70° C. to 180° C., more desirably from 80° C. to 160° C.

Examples of such thermal initiators include di(4-tert-butylcyclohexyl) peroxydicarbonate, tert-butyl peroxyneodecanoate, tert-butyl peroxypivalate, dilauroyl peroxide, 2,2'-azodi(isobutyronitrile), 2,5-dimethyl-2,5-di(2-ethylhexanoylperoxy)hexane, tert-butyl peroxy-2-ethylhexanoate, tert-butyl peroxybenzoate, and so on.

When present, the thermal initiator may suitably be present in an amount of from about 0.1 to about 5 parts, desirably from about 0.2 to about 4 parts by weight per 100 parts of the photocurable resin and monomer.

Fillers

Optionally, the underfill composition according to the present invention can also include filler. The filler used herein can be conventional inorganic fillers such as alumina, silica, and magnesia. The preferable fillers are alumina and silica with a spherical shape. The preferred average particle size of the filler is from 1 nm to 20 μm, desirably from 5 nm to 10 μm.

Other Additives

The underfill composition of the present invention may additionally include other additives that are commonly used in the art, such as, pigments, antioxidants, tougheners, defoamers, silane coupling agents and so on if necessary.

The underfill composition according to the present invention has a viscosity ranging from 50 mPa·s to 10000 mPa·s, desirably 100~5000 mPa·s, and more desirably 150~1500 mPa·s so as to achieve fast flow speed and meet the requirements of jetting dispense.

Packaging Process Using the Underfill Composition

In another aspect of the present invention, provided is a packaging process using the underfill composition according to the present invention. The packaging process according to the present invention can accurately control the underfill flow so as not to cause contamination and not sacrifice throughput.

Figure 2:
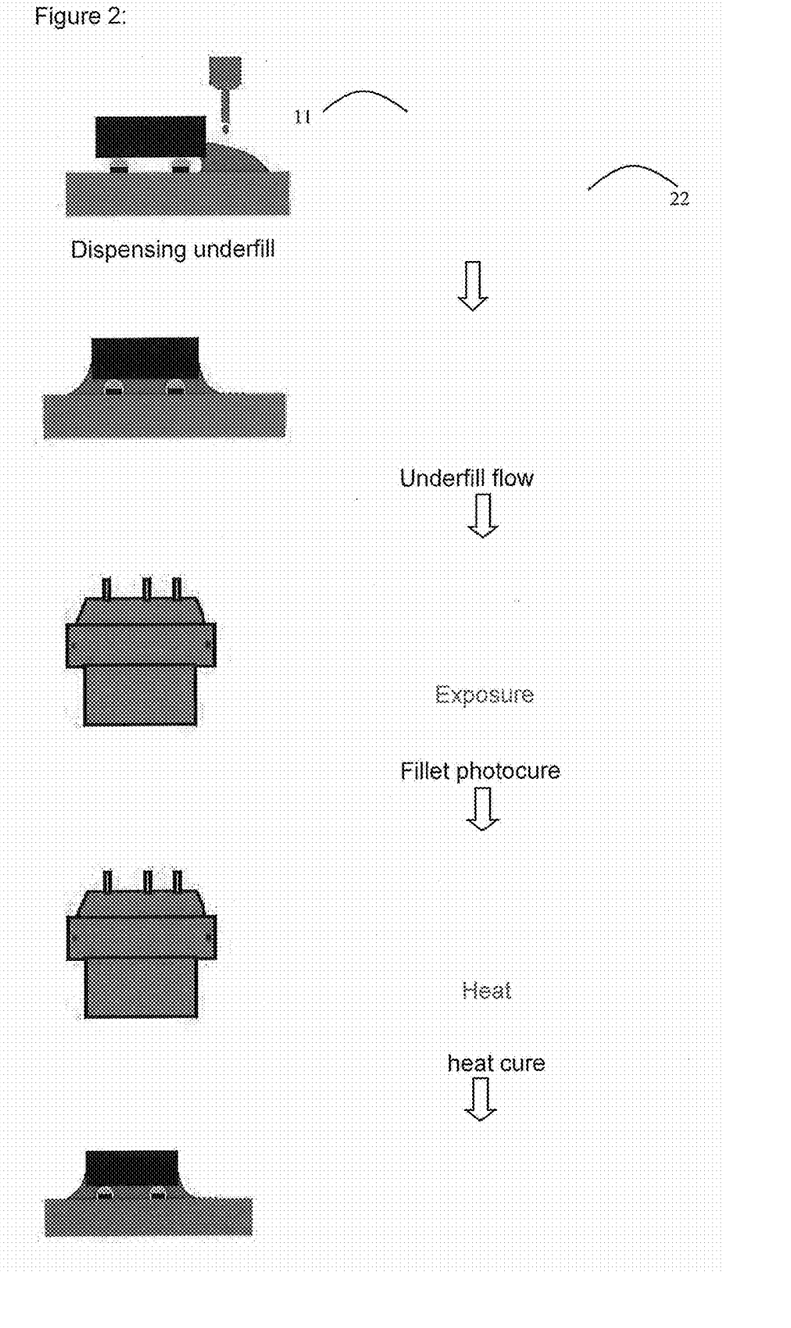
FIG. 2 schematically shows the packaging process using the underfill composition of the present invention.

The packaging process using the underfill composition according to the invention mainly comprises the following steps, and is described with reference to FIG. 2. Those skilled in the art would understand that the following steps focus on the parts of the packaging process where the present invention relates to, and besides these steps, the packaging process of the present invention can also comprise other steps or procedures commonly employed in the art.

In step a), an assembly of a package 11 and a circuit board 22 is provided. The assembly to be packaged can be prepared in any manners that are commonly used in the art. The packages can be used herein include CSPs, BGAs, LGAs, POPs etc.

In step b), a suitable amount of the underfill composition according to the invention is dispensed on a suitable position in any manners that are commonly used in the art, such as jetting dispense. The amount of the underfill composition used herein can be controlled according to the practical requirements to completely fill the gap and form desired fillet without flowing out. The amount of the underfill composition used herein can be practically determined by those skilled in the art.

In step c), after the underfill composition is dispensed, it flows by capillary action to the gap between the package and the circuit board and forms fillet. Depending on the viscosity of the underfill composition, the circuit board can be preheated to accelerate the flow speed of the underfill composition. In a preferred embodiment of the present invention, the preheating of the circuit board is dispensed with.

In step d), after the fillet is formed, a photo-curing step is conducted so as to partially or fully cure the fillet by exposure to a light of 250 nm to 850 nm, preferably of 300 nm to 450 nm, with an intensity of 30~4000 mJ/cm$^2$ and preferably 100~3000 mJ/cm$^2$. In an embodiment of the present invention, the fillet is fully cured under exposure to the light. The cure time during the photo-curing can be controlled according to the practical requirements, for example by adjusting the wavelength of the light and/or the intensity of the light. Typically, the fillet can be cured within several seconds. As mentioned previously, if heat cure is applied, the viscosity of the underfill composition would decrease initially with temperature rising before the occurrence of the cure reaction and hence it would flow out and lead to adhesive contamination of electrical elements like resistors around the package. Curing the fillet by exposure to the light as in the present invention can prevent the underfill composition from flowing out during the subsequent heat cure step and thus avoid the contamination.

In step e), after the fillet is partially or fully cured, the uncured underfill composition can be completely cured at an elevated temperature in a range of 60° C. to 250° C., preferably of 70° C. to 200° C., more preferably of 80° C. to 160° C. The cure time during the heat cure can be controlled according to the practical needs, for example by selecting the temperature. Typically, the cure time of the heat cure can be 0.1 min to 30 min, preferably 0.2 min to 20 min, more preferably 0.5 min to 10 min.

EXAMPLES

The present invention will be further described and illustrated in more detail with reference to the following examples, which, however, are not intended to restrict the scope of the present invention.

Materials Used in the Examples

Epoxy Resins:
  Bisphenol-A epoxy: Epiclon 850CRP (Trade name, from DIC);
  Bisphenol-F epoxy: Epiclon 830CRP (Trade name, from DIC);
  A mixture of bisphenol-A and bisphenol-F epoxy: ZX-1059 (Trade name, from TOHTO Kasei Co. Inc., Japan)
  Bisphenol-A epoxy: RE310S (Trade name, from Nippon Kayaku)
  Tert-butyl phenol glycidyl ether: Heloxy Modifier 65 (Trade name, from Momentive)

Latent Epoxy Curing Agent:
  Modified imidazole derivate: LSA-H0401 (Trade name, from Asahi Kasei)

Photocurable Resins or Monomers:
  Epoxy acrylate oligomer: Ebecryl 3700 (Trade name, from Cytec)
  Difunctional acrylate monomer: SR833S (Trade name, from Sartomer)

Isobornyl methacrylate (hereinafter referred to as IBOMA)

Glycidyl methacrylate (hereinafter referred to as GMA)

Photoinitiator:

Darocur 1173 (Trade name, from CIBA)

Thermal Initiator:

Trigonox 21s (Trade name, from AKZO NOBEL)

Other Additives:

Pigment: carbon black, Munarch 120 (Trade name, from Cabot)

Prohibitor: hydroquinone (purity: 99%)

Defoamer agent: PC1344 (Trade name, from Solutia)

Test Methods

Viscosity

The viscosity of the underfill composition is measured using Brookfield Viscometer RVT DV-II CP41/20 rpm, at 25° C., with reference to ASTM D1084.

Flow Time of the Underfill Composition

Figure 3:
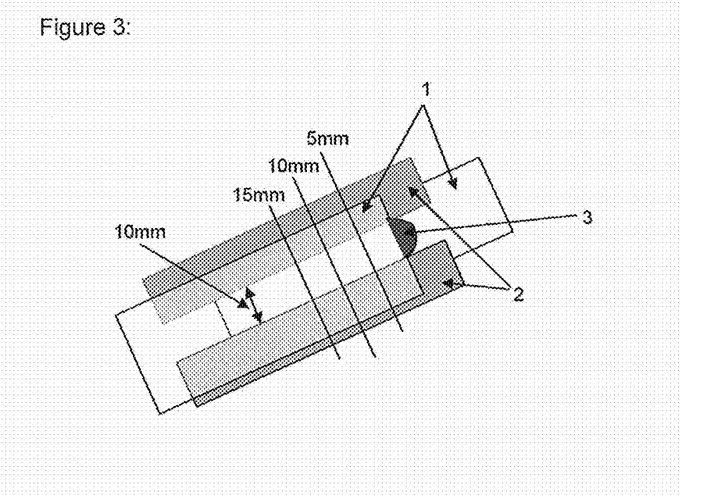
FIG. 3 schematically shows a device for testing the flow time of the underfill composition.

A test device as illustrated in FIG. 3 is prepared as below to test the flow time of the underfill composition.

Providing two glass slides 1 with two rectangular spacers 2 sandwiched therebetween, the distance between the two glass slides 1 is controlled by the thickness of the two spacers 2. In the examples of the present invention, the two spacers 2 have an equal thickness of 80 μm, and the distance between the two spacers 2 is 10 mm.

At the temperature of 25° C., dispensing 0.2 ml of the underfill composition at the starting point 3 of the device, recording the time respectively when the composition flows to the mark lines of 5 mm, 10 mm and 15 mm to determine the flow time of the underfill composition.

Overflow Distance after Cure

Figure 4:
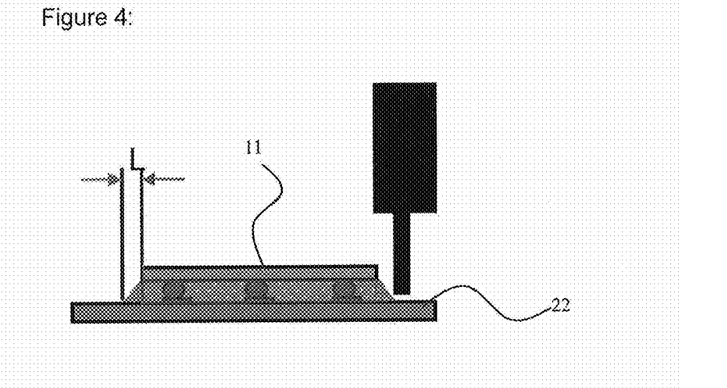
FIG. 4 schematically shows a system for testing the flow distance of the fillet.

The overflow distance is determined by the difference of flow distances of the fillet before cure and after cure. Referring to FIG. 4, a package 11 and a circuit board 22 as below are used in the test:

Package: 12×12 mm BGA, 228 I/O, 0.5 mm Pitch, SAC405

Board: 1.0 mm Thick FR-4, AUS5 Solder Mask, OSP-Cu Finish, 1-6-1 Buildup.

100 mg of the underfill composition is dispensed at the temperature of 25° C. and then flows by capillary action to completely fill the gap between the package and the board and forms fillet. The width of the fillet is measured as L1.

The fillet is partially cured by exposure to a UV light having a wavelength of 365 nm irradiated from Fusion UV conveyer system (commercially from Fusion) with the light intensity of 2 J/cm². And then, the underfill composition is fully cured by heating at the temperature of 130° C. for 10 min. The width of the fillet is measured as L2.

The overflow distance ΔL is calculated by ΔL=L2−L1.

Capacitor Contamination

Figure 5:
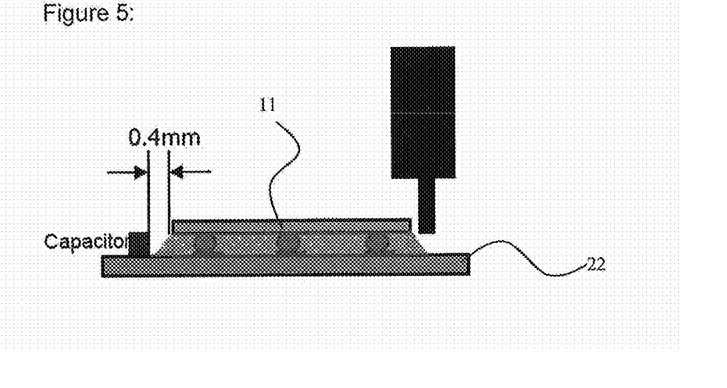
FIG. 5 schematically shows a system for testing the capacitor contamination.

Referring to FIG. 5, the package 11 and the board 22 mentioned above in the overflow distance test are used in this test except that a capacitor is assembled at a distance of 0.4 mm from the BGA.

100 mg of the underfill composition is dispensed at the temperature of 25° C. and then flows by capillary action to completely fill the gap between the package and the board and forms fillet.

The fillet is partially cured by exposure to a UV light having a wavelength of 365 nm irradiated from Fusion UV conveyer system (commercially from Fusion) with the light intensity of 2 J/cm². And then, the underfill composition is fully cured by heating at the temperature of 130° C. for 10 min.

Visually check if the capacitor around the package is contaminated by the underfill composition.

Examples 1 to 3 and Comparative Example 1

Underfill compositions 1 to 3 and comparative example 1 are formulated according to Table 1.

Each composition is formulated traditionally by mixing the components in their respective amounts as listed in Table 1 in a suitable container with stirring.

Comparative example 1 is formulated without photoinitiator.

Various tests are conducted to each composition according to the methods mentioned above, and the results are also shown in Table 1.

TABLE 1

| Components | | Comparative example (g) | Example 1 (g) | Example 2 (g) | Example 3 (g) |
|---|---|---|---|---|---|
| ZX-1059 | | 20.2 | 20.2 | — | 11.16 |
| Epiclon 830CRP | | — | — | 11.0 | — |
| RE310S | | 30.0 | 30.0 | 25.7 | — |
| Epiclon 850CRP | | — | — | — | 27.0 |
| Ebecryl 3700 | | — | — | 3.74 | 8.0 |
| SR833S | | 9.95 | 9.95 | 13.45 | 11.92 |
| Heloxy modifier 65 | | 6.0 | 6.0 | 4.30 | 8.0 |
| IBOMA | | 4.96 | 3.6 | 3.84 | 2.6 |
| GMA | | 8.0 | 8.0 | 7.68 | 8.0 |
| Hydroquinone | | 0.05 | 0.05 | 0.05 | 0.08 |
| Modified imidazole derivate | | 20.0 | 20.0 | 28.00 | 20.0 |
| Trigonox 21s | | 0.6 | 0.6 | 0.6 | 0.6 |
| Darocur 1173 | | — | 1.4 | 1.4 | 1.4 |
| Carbon black | | 0.04 | — | 0.04 | 0.04 |
| Defoamer agent | | 0.2 | 0.2 | 0.2 | 0.2 |
| Total | | 100 | 100 | 100 | 100 |
| Viscosity, mpas Brookfield CP41/20 | | 353 | 349 | 452 | 368 |
| Flow time (s) @ 25° C. | 5 mm | 15 | 13 | 16 | 12 |
| | 10 mm | 49 | 45 | 66 | 56 |
| | 15 mm | 108 | 103 | 153 | 131 |
| UV cure (wavelength: 365 nm Intensity: 2000 mJ/cm²) | | Uncured | Fillet gel after UV | Fillet gel after UV | Fillet gel after UV |

TABLE 1-continued

| Components | Comparative example (g) | Example 1 (g) | Example 2 (g) | Example 3 (g) |
|---|---|---|---|---|
| Overflow distance after curing | 0.32 mm | 0.06 mm | 0.07 | 0.07 mm |
| Capacitor contamination | YES | NO | NO | NO |

It can be seen from Table 1 that the underfill compositions of the present invention (examples 1 to 3) show good performances in view of overflow control and adhesive contamination. Specifically, the overflow distance of the underfill compositions according to examples 1 to 3 can be controlled accurately in a desired range, for example, 0.06 mm, which is much shorter than that of the comparative example 1 (0.32 mm). Meanwhile, the flow time of each underfill composition according to examples 1 to 3 is comparable with the comparative example 1 or is acceptable in the art, which ensures an unreduced throughput.

The advantages of the packaging process of the present invention have been demonstrated with the various test results of the underfill composition of the present invention. Specifically, the packaging process using the underfill composition according to the present invention can fulfil the advantages of the underfill composition without sacrifice manufacturing throughput.

The present invention is illustrated in details in the embodiments; however, it is apparent for those skilled in the art to modify and change the embodiments without deviating from the spirit of the invention. All the modifications and changes should fall in the scope of the appended claims of the present application.

What is claimed is:

1. A one part underfill composition comprising:
    an epoxy resin component,
    a latent epoxy curing agent,
    a photocurable resin or monomer,
    a photoinitiator,
    a filler, and
    a thermal initiator wherein the epoxy resin component comprises at least one multifunctional epoxy resin, together with one or more monofunctional epoxy resins, wherein the multifunctional epoxy resin is included in an amount within the range of about 40 wt. % to 95 wt. % of the total epoxy resin component.

2. The underfill composition according to claim 1, wherein epoxy resin comprises about 10 wt. % to about 90 wt. % of the total composition.

3. The underfill composition according to claim 1, wherein the multifunctional epoxy resin is selected from the group consisting of bisphenol-A epoxy resins, bisphenol-F epoxy resins, novolac epoxy resins, 2,6-diglycidylphenyl glycidyl ether, naphthalene epoxy resins, cycloaliphatic epoxy resins, polyepoxy compounds based on aromatic amines and epichlorohydrin, polyglycidyl derivatives of phenolic compounds, polyepoxides prepared from polyols, polybutadiene and the like, polyglycidyl derivatives of phenol-formaldehyde novolacs, and polyglycidyl adducts of amines, aminoalcohols and polycarboxylic acids.

4. An underfill composition comprising:
    an epoxy resin component,
    a latent epoxy curing agent,
    a photocurable resin or monomer,
    a photoinitiator, and
    a thermal initiator,
wherein the epoxy resin component comprises at least one multifunctional epoxy resin together with one or more monofunctional epoxy resins, and wherein the one or more monofunctional epoxy resins has a viscosity of less than about 300 cps at 25° C.

5. An underfill composition comprising:
    an epoxy resin component,
    a latent epoxy curing agent,
    a photocurable resin or monomer,
    a photoinitiator, and
    a thermal initiator,
wherein the epoxy resin component comprises at least one multifunctional epoxy resin together with one or more monofunctional epoxy resins, and wherein the one or more monofunctional epoxy resins is(are) selected from the group consisting of p-tert-butyl phenyl glycidyl ether, cresyl glycidyl ether, neodecanoic acid glycidyl ether, alkyl C12-C14 glycidyl ether, butyl glycidyl ether, 2-ethylhexyl glycidyl ether, and nonylphenyl glycidyl ether.

6. The underfill composition according to claim 1, wherein the latent epoxy curing agent comprises about 0.5 wt. % to about 50 wt. % based on the total composition.

7. The underfill composition according to claim 1, wherein the photocurable resin or monomer comprises about 0.1 wt. % to about 50 wt. % based on the total composition.

8. The underfill composition according to claim 1, wherein the photocurable resin or monomer is selected from the group consisting of (meth)acrylate monomers or oligomers, vinyl ethers, and photocurable epoxy resins or monomers.

9. The underfill composition according to claim 1, wherein the photoinitiator comprises about 0.2 wt. % to about 10 wt. % based on the total composition.

10. The underfill composition according to claim 1, wherein the photoinitiator can be activated in a wavelength range of from about 250 nm to 850 nm.

11. The underfill composition according to claim 1, wherein the photoinitiator is selected from cationic-type photoinitiators and free-radical-type photoinitiators.

12. The underfill composition according to claim 1, wherein the thermal initiator is present in an amount of 0 wt. % to about 5 wt. % based on the total composition.

13. An underfill composition comprising:
    an epoxy resin component,
    a latent epoxy curing agent,
    a photocurable resin or monomer,
    a photoinitiator, and
    a thermal initiator
wherein the thermal initiator is selected from the group consisting of di(4-tert-butylcyclohexyl) peroxydicarbonate, tert-butyl peroxyneodecanoate, tert-butyl peroxypivalate, dilauroyl peroxide, 2,2'-azodi(isobutyronitrile), 2,5-dimethyl-2,5-di(2-ethylhexanoylperoxy)-hexane, tert-butyl peroxy-2-ethylhexanoate, and tert-butyl peroxybenzoate.

14. The underfill composition according to claim 1, wherein the filler is present in an amount of 0 wt. % to about 60 wt. % based on the total composition.

15. The underfill composition according to claim 1, wherein the filler is selected from the group consisting of alumina, silica and magnesia having a spherical shape, with an average particle size of from 1 nm to 20 μm.

16. The underfill composition according to claim 1, having a viscosity ranging from 50 mpas to 10000 mpas.

17. A packaging process using the underfill composition according to claim 1, comprising the steps of:
   a) providing an assembly of a package and a circuit board;
   b) dispensing the underfill composition;
   c) the underfill composition flowing by capillary action to fill the gap between the package and the circuit board with or without board preheating, and forming fillet;
   d) partially or fully curing the fillet by exposure to a UV light and/or a visible light; and
   e) completely curing the uncured underfill composition by heat.

18. The packaging process according to claim 17, wherein the package is selected from the group consisting of CSP, BGA, LGA, and POP.

19. The packaging process according to claim 17, wherein the intensity of the light in step d) is from 30 mJ/cm$^2$ to 4000 mJ/cm$^2$.

20. The packaging process according to claim 17, wherein the light has a wavelength within the range of 250 nm to 850 nm.

21. The packaging process according to claim 17, wherein the heat cure step e) is conducted at a temperature in the range of 60° C. to 250° C.

22. The underfill composition according to claim 1, wherein the photoinitiator is selected from the group consisting of benzophenone, acetophenone, chlorinated acetophenone, dialkoxyacetophenones, dialkylhydroxyacetophenones, dialkylhydroxyacetophenone esters, benzoin, benzoin acetate, benzoin alkyl ethers, dimethoxybenzoin, dibenzylketone, benzoylcyclohexanol and other aromatic ketones, acyloxime esters, acylphosphine oxides, acylphosphonates, ketosulfides, dibenzoyldisulphides, diphenyldithiocarbonate, diphenyl(2,4,6-trimethylbenzoyl) phosphine oxide, phosphonium salts, sulfonium salts, and iodonium salts.

* * * * *

UNITED STATES PATENT AND TRADEMARK OFFICE
CERTIFICATE OF CORRECTION

PATENT NO. : 9,688,892 B2  
APPLICATION NO. : 14/804418  
DATED : June 27, 2017  
INVENTOR(S) : Xiaolong Hu et al.

Page 1 of 1

It is certified that error appears in the above-identified patent and that said Letters Patent is hereby corrected as shown below:

In the Specification

Column 2, Line 42: Change "2,6-diglycidyiphenyl" to -- 2,6-diglycidylphenyl --.

Column 2, Line 51: After "300", insert -- cps --.

Column 6, Line 27: Change "ploybutadiene" to -- polybutadiene --.

Column 7, Line 58: Change "ethoxylatedn" to -- ethoxylated --.

Column 7, Line 59: Change "trycyclodecane" to -- tricyclodecane --.

Column 8, Line 43: Change "acyiphos" to -- acylphos --.

Column 13, Line 25: Change "fulfil" to -- fulfill --.

In the Claims

Column 15, Line 4: Change "20 μm" to -- 20 nm --.

Signed and Sealed this  
Eighth Day of May, 2018

Andrei Iancu  
*Director of the United States Patent and Trademark Office*